United States Patent [19]

Bednorz et al.

[11] 4,104,676

[45] Aug. 1, 1978

[54] SEMICONDUCTOR DEVICE WITH PRESSURE ELECTRICAL CONTACTS HAVING IRREGULAR SURFACES

[75] Inventors: Klaus Bednorz; Jon W. Johansen; Fritz Scheidel, all of Munich, Germany

[73] Assignee: Siemens Aktiengesellschaft, Munich, Germany

[21] Appl. No.: 750,074

[22] Filed: Dec. 13, 1976

[30] Foreign Application Priority Data

Dec. 15, 1975 [DE] Fed. Rep. of Germany ....... 2556469

[51] Int. Cl.$^2$ .................... H01L 23/42; H01L 23/44; H01L 23/46
[52] U.S. Cl. ...................................... 357/79; 357/65; 357/68; 357/81; 357/72
[58] Field of Search ...................... 357/65, 79, 74, 80, 357/81, 68, 72

[56] References Cited

U.S. PATENT DOCUMENTS

| | | | |
|---|---|---|---|
| 3,291,578 | 12/1966 | Fahey | 357/79 |
| 3,387,191 | 6/1968 | Fishman et al. | 357/81 |
| 3,480,842 | 11/1969 | Scharli | 357/79 |
| 3,702,975 | 11/1972 | Miller | 357/81 |
| 3,706,915 | 12/1972 | Lootens et al. | 357/74 |
| 3,858,096 | 12/1974 | Kuhrt et al. | 357/81 |
| 3,860,949 | 1/1975 | Stoeckert et al. | 357/81 |

*Primary Examiner*—Andrew J. James
*Attorney, Agent, or Firm*—C. L. Menzemer

[57] ABSTRACT

The present invention is directed to a semiconductor device comprising a body of semiconductor material having at least one p-n junction therein. The body of semiconductor material has opposed, flat, substantially parallel main faces and an edge portion extending between the two main faces. The p-n junction is exposed at the edge portion of the body. Metal electrodes are affixed to at least a portion of the two faces of the body of semiconductor material. A layer of protective material covers the edge portion, the metal electrodes, and any exposed portions of the two main faces of the body. Electrical contacts made to the body of semiconductor material by lead electrodes in compression bonded contact with the metal electrodes and in some cases with at least a portion of the main faces of the body of semiconductor material. The surface of the lead electrodes in contact with the metal electrodes and in some instances the main faces of the semiconductor body is comprised of a plurality of lands and grooves.

7 Claims, 3 Drawing Figures

SEMICONDUCTOR DEVICE WITH PRESSURE ELECTRICAL CONTACTS HAVING IRREGULAR SURFACES

BACKGROUND OF THE INVENTION

1. Field of the Invention

The present invention is in the field of compression bonded discrete semiconductor devices.

2. Description of the Prior Art

Compression bonded semiconductor devices are generally well known in the art.

The use of protective coating on at least the edge portions of bodies of semiconductor material is also generally well known.

The insulating protective coating on the edge of the semiconductor body serves to protect the pn-junction or the pn-junctions which occur at the semiconductor's edge, such junctions being very sensitive to external influences such as, for example, moisture. The insulating protective coating is of very great importance as far as the functioning of the semiconductor component is concerned because, when loading in the blocking direction, the properties of the semiconductor component are primarily determined by processes which take place at the semiconductor's periphery.

Employing lead electrodes with a ridged surface is also known in the prior art. The purpose of the ridges on the known types of semiconductor devices, and which are produced, for example, by a specific roughening of the contact faces by lapping, is to improve the contact between the lead electrodes and the body of the semiconductor material. In addition, ridges and the attendant grooves make it possible to balance out the different thermal expansion coefficients of the lead electrodes and of the semiconductor material in the direction of the main surfaces of the semiconductor body. A semiconductor device has also been described in the prior art, one lead electrode of which is provided with ridges which consist of a metal which alloys with the electrode on the body of semiconductor material. In this case, the purpose of the ridge is to so raise the pressure exerted on the semiconductor element's electrode that a diffusion alloy is soon produced at the operating temperature of the semiconductor device. By this means, there is produced a positive bond between the lead-electrode and the semiconductor without any special alloying process.

In the case of semiconductors having a relatively large surface area, such as, for example, 20 mm$^2$ and above, it is a relatively simple matter to apply the insulating protective coating to the semiconductor's edge, it being possible to carry out such a process semi-automatically. However, the application of the insulating protective coating to the semiconductor's edge is an intricate and wasteful process in the case of semiconductors having an area of only a few mm$^2$.

Attempts have been made in the past to coat not only the edges of small bodies of semiconductor materials, i.e., 15 mm$^2$ and less, but also the opposed major faces of the bodies. It will be understood that in coating the opposed major faces, the coating was applied over the metal electrodes affixed to the major faces.

These attempts have not been successful since it was then impossible to establish good electrical contact between the metal electrodes and the lead electrodes.

SUMMARY OF THE INVENTION

The present invention is characterized by the fact that the main surfaces of the semiconductor body, including the metal electrodes affixed thereto, are also provided with the protective coating, and that the height of the grooves, relative to the lands in the surface of the lead electrode, is greater than the thickness of the protective coating on the main faces or surfaces of the semiconductor body and that the hardness of the lead electrode is greater than that of the protective coating, at least where the lead electrode makes contact with the metal electrode and semiconductor element.

Advantageously, at least at the location where the lead electrode abuts against the metal electrode on the surface of the semiconductor body, the said lead electrode consists of a sintered metal which displays open pores to the adjacent surface. The sintered metal can consist, for example, of copper with a space-filling factor lying between 0.6 and 0.8. The pore-depth is preferably greater than twice the thickness of the protective coating. The lead electrode can also consist of solid metal which has lands and grooves on the surface abutting against the semiconductor or metal electrode surface.

In this case, the lead electrode can be made of copper which is provided with a layer of tin on the surface abutting the semiconductor or metal electrode surface. The lead electrode can also be made of silver. The groove depth of this electrode is preferably greater than twice the thickness of the protective coating. With the abovenamed lead electrodes, it is advantageous if at least the part abutting the semiconductor has a Brinell hardness lying between 5 and 20 kg/mm$^2$.

BRIEF DESCRIPTION OF THE DRAWINGS

The invention will now be described in greater detail and by way of example, on the basis of the appended drawings in which.

DESCRIPTION OF PREFERRED EMBODIMENTS

Figure 1:
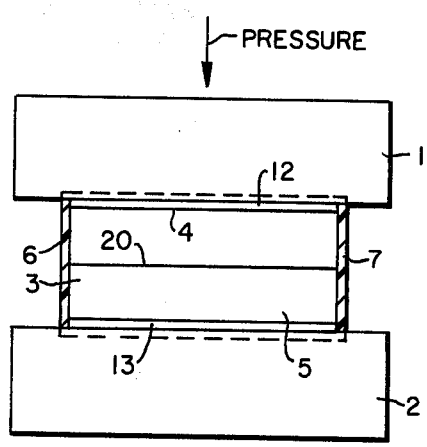
FIG. 1 presents, schematically, a side view of a semiconductor device of this invention.

With reference to FIG. 1, there is shown two lead electrodes 1, 2 between which is located a body 3 semiconductor material. Semiconductor body 3 consists, for example, of a silicon with main opposed, flat, substantially parallel faces 4, 5 and an edge portion 6. A p-n junction 20 is contained within the body 3 and terminates at the edge 6 of the body 20. Main faces 4, 5 of body 3 are provided with the respective metal electrodes 12 and 13 which, for purposes of illustration, are shown with a greatly exaggerated thickness. Semiconductor body 3 is provided with a protective coating 7 which encloses not only edge 6 of the semiconductor body 3 but also the main faces 4, 5 and the metal electrodes 12, 13. The protective coating is shown by the broken lines within lead electrodes 1, 2 in order to indicate the position of the protective coating before the lead electrodes 1, 2 are brought in compression contact with metal electrodes 12 and 13.

Figure 2:
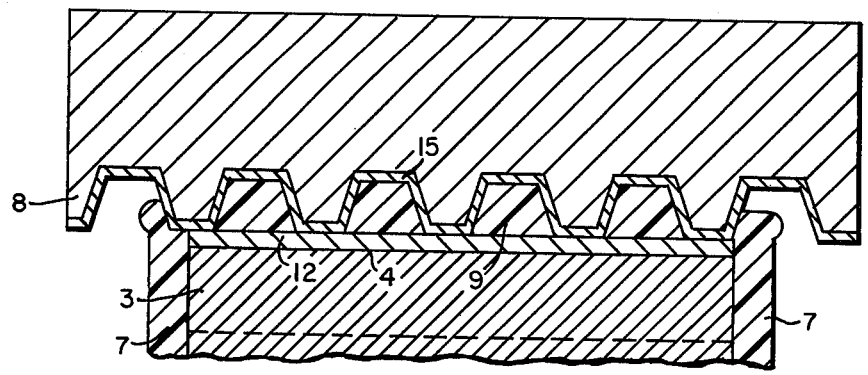
FIG. 2 presents a section through a lead electrode and part of the body of the semiconductor in accordance with one embodiment of the present invention.

FIG. 2 shows a first constructional example in which the same reference numbers are used for like parts. Lead electrode 1 is, in this case, provided with the schematically drawn lands 8 which are separated by grooves 9. The lands 8 can be produced, for example, by sandblasting, etching, lapping, scratching, sawing or machining the surface of lead electrode 1.

Lead electrode 1 is pressed on to main surface 4 of semiconductor body 3, or on to the metal electrode 12, using a pressure which is usual for pressure-contacted semiconductor components. This pressure can be as high as 50 to 500 kg/cm², for example. By pressing the lead electrode 1, the protective coating between the grooves and the semiconductor body with metal electrode 12 is caused to flow into the grooves 9 until said lands 8 are seated on and in electrical contact with electrode 12. For this to occur, grooves 9 must be deeper than the thickness of the protective coating 7. The greater the area of the lead electrodes abutting the semiconductor body for constant recess area, the deeper must be grooves 9. In the case shown, it is sufficient for the depth of the grooves 9 to be twice the thickness of the protective coating 7 originally lying on the metal electrode 12. The original position of the protective coating 7 in the region of the top main face 4 is also indicated in this case by the broken line.

At least in the region where it lies on protective coating 7, the lead electrode 1 consists of a material whose hardness is greater than that of the protective coating. However, the hardness should not be so great that the semiconductor is damaged by the scoring-effect produced by lands 8. A Brinell hardness of less than 20 kg/mm² has proved suitable. Such a hardness can, for example, be produced by a layer 15 of tin applied electrolytically to a copper substrate. However, the hardness should not be less than 5 kg/cm², otherwise the lead electrode 1 would tend to creep sideways. Elevations 8, at least where they abut against lead electrode 12 or against main face 4 of semiconductor 3, are harder than the protective coating. This requirement can be met, for example, by using a tinned copper electrode 1, on the one hand, and using a protective coating 7 consisting of an elastomer such as, for example, silicone rubber, silicone resin and silicone lacquer, on the other. It is also possible, for example, to use a silver electrode which, if need be, can be provided with a coating of soft metal.

Figure 3:
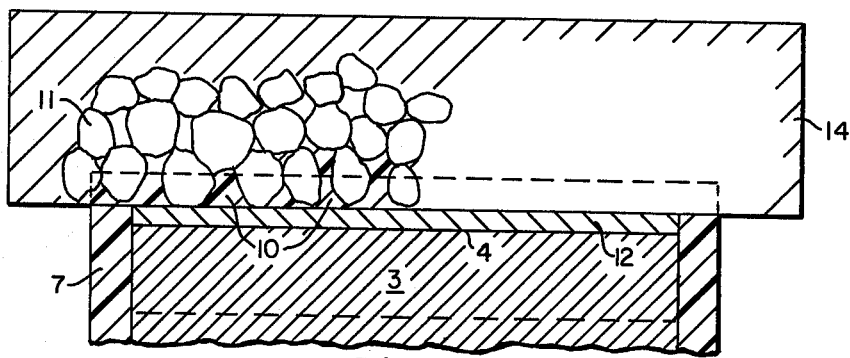
FIG. 3 presents a section through a lead electrode and part of the semiconductor in accordance with a second embodiment of the present invention.

FIG. 3 shows, by way of example, a form of construction in which a lead electrode 14 consisting of a sintered metal, at least on the side abutting semiconductor 3 is used in place of the solid metal electrode 1 of FIG. 1. This sintered metal, whose method of production is known, can consist, for example, of a sintered copper powder whose particles or grains are indicated by 11. Between the powder particles are pores which are, at least, open to the surface of metal electrode 12. It is, in this case, recommended to employ a powder having a space-filling factor of between 0.6 and 0.8, that is, 60–80% of the sinter-metal is occupied by solid constituents. The sinter-metal can also consist of silver granules. The porosity of the metal sinter can decrease continuously with distance from the semiconductor, so that, on the side of lead electrode 14 away from the semiconductor, the porosity tends toward zero. Lead electrode 14 can also consist, for example, of a layer of solid metal and a layer of sintered metal. The Brinell hardness of the sintered metal on the side abutting semiconductor 3 should likewise be, at most, 20 kg/mm². It is important for the sintered metal to expose open pores to semiconductor 3.

If lead electrode 14 is pressed on to metal electrode 12 or on main face 4 of semiconductor 3, the granular particles 11 force the protective coating 7 into pores 10 which lie between said granular particles 11. In this case, the original position of protective coating 7 in the region of lead electrode 12 is also shown by the broken line. The porosity is so matched to the thickness of protective coating 7 that the said coating can be completely forced into pores 10. In this connection, it is advantageous for the pore-depth to be greater than twice the thickness of the protective coating.

It is possible, in accordance with the invention, to apply the protective coating by simple immersion of the body of semiconductor material into a mass of the coating material.

The selected form of contacting has shown itself to be fully satisfactory, both with regard to its thermal properties as well as with regard to its electrical properties. The forms of construction shown by way of example in FIGS. 2 and 3 are limited, for simplicity, to showing only one lead electrode. The construction of the other lead electrodes can correspond to the form of construction shown. However, it is also possible to use two lead electrodes having different forms of construction in a semiconductor element.

We claim as our invention:

1. A semiconductor device comprising, a body of semiconductor material, said body having opposed, flat, substantially parallel main faces and an edge portion extending between said main faces, said body containing at least one pn junction, said pn junction being exposed at said edge portion of said body, a metal electrode affixed to and in electrical contact with a least a portion of each of said main faces, at least one lead electrode having at least a portion of a surface in physical and electrical contact with at least a portion of at least one of said metal electrodes, at least a portion of said surface of said lead electrode being held in said physical and electrical contact with said metal electrode by a compressive force, said surface of said lead electrode being comprised of lands and grooves with said lands being the portion of the surface of said lead electrode in physical and electrical contact with said metal electrode, a layer of a protective coating disposed on said edge portion of said body of semiconductor material and on at least a portion of said main faces, said layer of protective coating extending over at least a portion of said metal electrode and into the grooves in the surface of said lead electrode, the grooves in the surface of said lead electrode having a depth greater than the thickness of the protective layer and at least the land portions of the surface of the lead electrode having a Brinell hardness greater than the hardness of the protective layer.

2. The semiconductor device of claim 1 in which the grooves on the surface of the lead electrode have a depth equal to at least twice the thickness of the protective layer.

3. The semiconductor device of claim 1 in which the Brinell hardness of at least the land portions of the surface of the lead electrode is between 5 kg/cm² and 20 kg/cm².

4. The semiconductor device of claim 1 in which at least the land portions of the surface of the lead electrode is comprised of a tinned copper and the protective coating consists of a material selected from the group consisting of silicone rubber, silicone resin and silicone lacquer.

5. The semiconductor device of claim 1 in which at least the land portions of the surface lead electrode is silver and the protective coating consists of a material selected from the group consisting of silicone rubber, silicone resin and silicone lacquer.

6. The semiconductor device of claim 1 in which at least the surface of the lead electrode in contact with the metal electrode is comprised of a porous sintered metal and the open pores form the grooves.

7. The semiconductor device of claim 6 in which the sintered metal has a space-filling factor of from 0.6 to 0.8.

* * * * *